(12) United States Patent
Clube et al.

(10) Patent No.: US 9,280,056 B2
(45) Date of Patent: Mar. 8, 2016

(54) METHOD AND SYSTEM FOR PRINTING HIGH-RESOLUTION PERIODIC PATTERNS

(75) Inventors: Francis Clube, Hausen (CH); Harun Solak, Brugg (CH)

(73) Assignee: EULITHA A.G., Villigen/PSI (CH)

( * ) Notice: Subject to any disclaimer, the term of this patent is extended or adjusted under 35 U.S.C. 154(b) by 412 days.

(21) Appl. No.: 13/979,489

(22) PCT Filed: Jan. 10, 2012

(86) PCT No.: PCT/IB2012/050128
§ 371 (c)(1),
(2), (4) Date: Aug. 2, 2013

(87) PCT Pub. No.: WO2012/095795
PCT Pub. Date: Jul. 19, 2012

(65) Prior Publication Data
US 2013/0308112 A1 Nov. 21, 2013

Related U.S. Application Data

(60) Provisional application No. 61/431,928, filed on Jan. 12, 2011.

(51) Int. Cl.
*G03F 7/20* (2006.01)
(52) U.S. Cl.
CPC .......... *G03F 7/70091* (2013.01); *G03F 7/7035* (2013.01); *G03F 7/70408* (2013.01)
(58) Field of Classification Search
CPC ............ G03F 7/70408; G03F 7/70325; G03F 7/7035; G03F 7/70091
See application file for complete search history.

(56) References Cited

U.S. PATENT DOCUMENTS

| 5,113,402 A * | 5/1992 | Itani ......................... G02F 1/37 257/E21.028 |
| 6,373,553 B1 * | 4/2002 | Singh .................. G03F 7/70408 355/53 |
| 2008/0100892 A1 * | 5/2008 | Hendriks ............. G11B 7/1369 359/33 |

(Continued)

FOREIGN PATENT DOCUMENTS

| EP | 1810085 B1 | 3/2011 |
| WO | 2006045439 A2 | 5/2006 |
| WO | 2012049638 A1 | 4/2012 |

OTHER PUBLICATIONS

Zanke et al., "Large-area patterning for photonic crystals via coherent diffraction lithography", J. Vac. Sci. Technol. B 22 (6), Nov./Dec. 2004, pp. 3352-3355.

*Primary Examiner* — Steven H Whitesell Gordon
(74) *Attorney, Agent, or Firm* — Laurence Greenberg; Werner Stemer; Ralph Locher

(57) ABSTRACT

A method for printing a desired periodic pattern includes providing a mask bearing a pattern of features having a period, providing a substrate bearing a photosensitive layer, arranging the substrate with a separation from the mask, generating collimated light with a wavelength and an intensity, at least the former of which may be temporally varied to deliver a spectral distribution of energy density, illuminating the mask pattern with the light while varying at least its wavelength so as to deliver a spectral distribution of energy density, such that the light-field transmitted by the mask is instantaneously composed of a range of transversal intensity distributions between Talbot planes. The layer is exposed to a time-integrated intensity distribution that prints the desired pattern. The separation, spectral distribution and period are arranged so that the time-integrated intensity distribution corresponds to an average of the range of transversal intensity distributions.

17 Claims, 3 Drawing Sheets

(56) References Cited

U.S. PATENT DOCUMENTS

| | | |
|---|---|---|
| 2008/0186579 A1 | 8/2008 | Solak |
| 2011/0199598 A1* | 8/2011 | Solak .................... G03B 27/58 355/67 |
| 2012/0009525 A1* | 1/2012 | Clube .................... G03B 27/54 430/322 |
| 2012/0092634 A1* | 4/2012 | Solak .................. G03F 7/70408 355/67 |
| 2012/0092635 A1 | 4/2012 | Solak et al. |
| 2012/0228475 A1* | 9/2012 | Pang .................... G02B 5/1842 250/208.1 |
| 2013/0329203 A1* | 12/2013 | Solak ....................... G03F 1/28 355/67 |

* cited by examiner

METHOD AND SYSTEM FOR PRINTING HIGH-RESOLUTION PERIODIC PATTERNS

This invention relates generally to the field of photolithography as employed for the fabrication of micro- and nano-structures, and it relates particularly to the field of photolithography based on the Talbot effect, or self-imaging.

Lithographic fabrication enables the formation of micro- and nano-patterns on surfaces. Photolithographic techniques achieve this by exposing a photosensitive surface to a light-field with an intensity distribution corresponding to the desired pattern. The photosensitive surface is usually a thin layer of a sensitive material, such as photoresist, which is coated either directly on a substrate surface or indirectly over intermediate layers of other materials. Chemical or physical changes that occur in the photosensitive layer as a result of the exposure are used in subsequent processes to obtain a desired pattern in the material of the substrate or in an intermediate layer of another material. In the most commonly used photolithographic technique an image of a pattern defined in a mask is projected onto the substrate surface using an optical system. The masks generally employed in such conventional systems are amplitude masks in which the pattern features are defined as open areas in a layer of an opaque material, usually chrome, on a transparent substrate. Phase-shift masks (PSMs) are alternatively used in which the pattern features are defined using a certain thickness of a material or a depth of recess into a material, so that the light propagating through those features is shifted in phase with respect to other propagating light, which then mutually interfere in the image plane to form the desired pattern. In the case of PSMs employed in projection, contact, proximity or conventional Talbot lithography, the mask is designed by considering the interference between all the diffraction orders transmitted by the mask. In the case of one-dimensional pattern, a PSM can reduce the minimum printable period by a factor of two with respect to an amplitude mask. This is mainly achieved by suppressing the 0th-order diffracted beam, thereby eliminating the intensity modulation produced by its interference with the 1st-order diffracted beams.

For many applications patterns are required that comprise a unit cell of pattern features that repeat in one or two dimensions, that is, periodic patterns. A specialized photolithographic technique for transferring such patterns from masks onto substrates is based on the Talbot effect. When a periodic pattern defined in a mask is illuminated with a collimated beam of monochromatic light, diffraction orders in the transmitted light-field reconstruct "self-images" of the pattern at regular distances from the mask in so-called Talbot planes. The separation of the self-images, S, which is known as the Talbot distance, depends on the illumination wavelength, λ, and period of the pattern, p, according to:

$$S \approx kp^2/\lambda \qquad \text{equ. (1)}$$

where k is a constant.

For a one-dimensional periodic pattern of lines and spaces, k=2. For a two-dimensional periodic pattern of features arranged on a hexagonal grid, k=1.5 if p represents the nearest-neighbour distance of the grid. Whereas this formula has good accuracy when p>>λ (i.e. when the light is diffracted at relatively small angles), it approximates less well as the magnitude of p approaches λ. Locating a photoresist-coated substrate at one of the self-image planes results in the mask pattern being printed into the photoresist (see, for example, C. Zanke, et al., "Large area patterning for photonic crystals via coherent diffraction lithography", J. Vac. Sci. Technol. B 22, 3352 (2004)). Furthermore, at intermediate distances between the self-image planes, Talbot sub-images are formed that have higher spatial frequencies than the pattern in the mask, which may be printed by placing a photoresist-coated substrate at one of these fractional Talbot planes. The printed results achieved using these techniques are improved when the duty cycle of the mask pattern (i.e. the dimension of the features as a fraction of the feature period) is selected to produce a high contrast of intensity distribution in the Talbot or fractional Talbot plane (see U.S. Pat. No. 4,360,586). It is also known in the prior art that the contrast of the Talbot images can be further enhanced by fabricating the periodic patterns in the mask using phase shifting materials. Photolithography using Talbot imaging is especially advantageous for printing high-resolution periodic patterns in view of the high cost of conventional, projection-type photolithographic systems for such patterns.

A major shortcoming of the Talbot technique, however, is that the intensity distributions of the self-images and sub-images are very sensitive to the distance from the mask, that is, they have a very narrow depth of field. This means that the substrate needs to be positioned very accurately with respect to the mask in order to correctly print the pattern. This becomes increasingly more difficult as the grating period is reduced because the depths of field of the self-images and sub-images depend on the square of the pattern period. Furthermore, if the pattern needs to be printed onto a substrate surface that is not very flat or if there are topographical structures on its surface, or the pattern needs to be printed into a thick layer of photoresist, it may be impossible to achieve the desired result.

Achromatic Talbot lithography has recently been introduced as a new method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, pp. 2705-2710 (2005), and European pat. no. EP1810085). It offers two significant advantages for lithographic applications: firstly, it overcomes the depth-of-field problem encountered using the classical Talbot method; and, secondly, for many pattern types it performs a spatial-frequency multiplication, that is, it increases the resolution of the printed features with respect to that of the pattern in the mask. In achromatic Talbot lithography (ATL) the mask is illuminated with a collimated beam from a light source with a broad spectral bandwidth, and beyond a certain distance from the mask the transmitted light-field forms a so-called stationary image whose intensity distribution is invariant to further increase in distance. In the case of a one-dimensional pattern of lines and spaces (i.e. a grating), the minimum distance, $d_{min}$, from the mask at which this occurs is related to the period of the pattern, p, in the mask and to the spectral bandwidth of the illumination, Δλ, by:

$$d_{min} \approx 2p^2/\Delta\lambda \qquad \text{equ. (2)}$$

Beyond this distance, the Talbot image planes for the different wavelengths are distributed in a continuous manner with increasing distance from the mask, which generates the stationary image. Thus, by placing a photoresist-coated substrate in this region exposes the substrate to the entire range of transverse intensity distributions formed between successive Talbot planes by light of a single wavelength. The pattern printed onto the substrate is therefore an average, or integration, of this range of transversal intensity distributions, which is substantially insensitive to longitudinal displacement of the substrate with respect to the mask. The technique therefore enables a much larger depth of field than with standard Talbot imaging, and a much larger depth of field than with conventional projection, proximity or contact printing.

The intensity distribution in an ATL image formed from a particular mask pattern using a particular spectral profile of illumination may be determined using modelling software that simulates the propagation of electromagnetic waves through and after the mask. Such simulation tools may be used to optimize the design of the pattern in the mask for obtaining a particular printed pattern at the substrate surface, as well as for determining the minimum distance from the mask at which a sufficiently stationary image is formed such that the change in feature size produced by a further increase in the distance is acceptable for the particular application concerned.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the printed pattern are generated by a part of the mask in which the period is substantially constant. Such patterns may be described as being quasi-periodic.

A drawback of ATL is that it requires a light source with a significant spectral bandwidth in order that the separation required between the mask and substrate is not disadvantageously large. The angular divergence of the different diffracted orders propagating from the mask produces spatial offsets between the different orders at the substrate surface resulting in imperfect image reconstruction at the pattern edges, which becomes worse with increasing separation. Fresnel diffraction at the edges of the diffracted orders also degrades the edges of the printed pattern, and this likewise gets worse with increasing separation. For these reasons laser sources, which have relatively small spectral bandwidth, are in most cases unsuitable for ATL.

A difficulty with applying non-laser sources, such as arc lamps or light emitting diodes, to ATL is producing an exposure beam that has both high intensity (for ensuring high throughput in a production process) and good collimation (for ensuring high-contrast imaging and minimizing loss of feature resolution). Obtaining good collimation from non-laser sources requires spatial filtering of their output beams which generally results in a large loss of power.

The advantages of the ATL technique may be obtained using a different but related technique that is disclosed European pat. no. EP1810085. In this scheme, the periodic pattern in the mask is illuminated by a collimated beam of substantially monochromatic light and during exposure the distance of the substrate from the mask is varied over a range corresponding to an integer multiple of the separation between successive Talbot image planes in order that an average of the intensity distributions between Talbot planes is printed on the substrate. The smallest displacement that may be employed is therefore equal to the separation of successive Talbot planes (when integer=1). With this displacement during exposure, the pattern printed on the substrate is substantially the same as that printed using the ATL technique. It is disclosed that the displacement may be performed either continuously or in a discrete way by exposing the substrate at multiple discrete positions over the range. Using the continuous displacement, the speed of displacement is necessarily constant in order that the desired average of the transversal intensity distributions is obtained, and using the discrete, or stepped, displacement, the exposure dose at each discrete position should necessarily be the same for the same reason. The general technique may be referred to as displacement Talbot lithography (DTL)

The average intensity distributions generated at the substrate using the ATL and DTL techniques are essentially equivalent, and both enable a large depth of field and spatial-frequency multiplication for the printed pattern. Generally, the DTL scheme can be used with much smaller separations of the substrate and mask than the ATL scheme. This reduces the degradation of the pattern edges and allows more efficient utilization of the output from the light source because of the less stringent requirement on collimation. Further, the DTL technique enables the use of laser sources, which may be preferred for production processes. The light from such sources can be formed into well-collimated beams with negligible loss of power, so minimize loss of feature resolution and maximize image contrast.

The structure of the patterns printed using DTL from a particular mask pattern may also be theoretically determined using simulation software.

A limitation of the DTL technique described in European pat. no. EP1810085 is that the longitudinal displacement of the substrate relative to the mask during exposure should correspond accurately to an integer multiple of the Talbot distance. When the displacement is exactly an integer multiple, the average intensity distribution exposing the substrate is independent of the initial separation of the substrate and mask, and so produces a uniform exposure of the pattern features on the substrate even if the mask and substrate are not accurately flat and parallel. If, on the other hand, the displacement is not an exact integer multiple of the Talbot distance because of, for example, mechanical hysteresis or limited stepping resolution of a displacement actuator, or because of inexact synchronization between the duration of the exposure by the illumination system and the displacement of the substrate, then the average intensity distribution depends on the initial separation. In this case, if the mask and substrate are not accurately flat and parallel, then a spatial variation of feature size is introduced into the printed pattern; or, if the mask and substrate are accurately flat and parallel but their separation is different for different substrates, then the size of the printed features varies from substrate to substrate; both of which may be problems for certain applications. These variations of feature size may be reduced by longitudinally displacing the substrate by a large number of Talbot distances relative to the mask, but this can introduce other problems such as degradation of the feature resolution (if the illumination beam is not well collimated), distortion of the feature shape (if the direction of displacement is not accurately longitudinal), degradation of the pattern edges (if the gap becomes too large), and disadvantageously requires larger travel range in the mechanical system.

International pat. appl. no. PCT/IB2011/054509 teaches a modification of the DTL technique for overcoming this limitation so as to enable periodic or quasi-periodic patterns to be printed uniformly and reproducibly without the requirement that the longitudinal displacement of the substrate relative to the mask during exposure corresponds to an integer multiple of the Talbot distance. It further enables periodic patterns to be printed uniformly and reproducibly when the presence of 2nd or higher diffraction orders in the transmitted light-field from the mask prevents an exact Talbot imaging and an exact Talbot distance. It additionally enables two-dimensional periodic patterns of features to be printed uniformly and reproducibly printed onto substrates when the periods of the pattern are different along different. It moreover enables patterns of features to be printed uniformly and reproducibly onto a substrate when the period of the pattern in the mask is not constant but varies either continuously, as in chirped gratings, or step-wise across the mask. The patent application instructs that the exposure dose per incremental displacement of the photoresist-coated substrate relative to the mask be varied during the displacement. This variation may be obtained by varying at least one of the speed of displacement and intensity of the exposure beam during the displacement. It teaches that it is advantageous that the exposure dose per incremental change of separation varies according to one of a truncated Gaussian profile, truncated cosine profile and triangular profile as the separation is changed during the exposure. Furthermore, it teaches that variation of the exposure energy density per incremental change of separation over the change of separation has a full width at half maximum (FWHM) that preferably corresponds to at least the Talbot distance of the light-field transmitted by the mask.

This modified DTL technique also has certain disadvantages. It too requires a controlled longitudinal displacement of the photoresist-coated substrate relative to the mask during the exposure and so imposes additional requirements on the mechanical structure and functionalities of the exposure system which can be difficult and costly to provide. In particular, it imposes requirements on the resolution, speed and hysteresis of the displacement of the substrate relative to the mask, and on the uniformity of the displacement over the area of the printed pattern. It also requires that the displacement is accurately orthogonal to the plane of the substrate because any lateral displacement of the substrate with respect to the mask during the exposure degrades the resolution of the printed pattern. Furthermore, since a high-resolution actuator(s), such as a piezo-electric transducer, is typically required for achieving the required displacement, and such an actuator is generally not included in standard contact or proximity mask aligners, the technique cannot be performed using those systems. The integration of high-resolution actuators in mask aligners is furthermore rendered difficult because a large displacement of the photoresist-coated substrate is generally also needed for loading and unloading of the substrates; and, moreover, the integration needs to assure that the displacement is obtained uniformly over the substrate area so that large patterns can be printed uniformly. For the case that the variation of exposure dose with incremental displacement of the substrate relative to the mask is obtained by varying the intensity of the exposure beam, it is additionally necessary that the intensity modulation is accurately synchronized with the displacement, which is difficult to obtain with the required accuracy if there is any hysteresis in the mechanical system that displaces the substrate relative to the mask.

It is therefore an object of the present invention to provide a method and apparatus for printing a periodic or quasi-periodic pattern of features that possesses the same advantages of the techniques of ATL, DTL and modifications thereof, namely the ability to print high-resolution periodic and quasi-periodic patterns with a large depth of focus and the possibility for spatial-frequency multiplication, but without the disadvantages and limitations of those techniques, namely, in the case of ATL, the difficulty of obtaining a high-intensity and well-collimated beam with a suitable spectral bandwidth and, in the case of DTL, the difficulty of providing the required relative motion of the photoresist-coated substrate relative to the mask during the exposure.

It is a further objective of the present invention to enable a precise control of the averaging over the range of intensity distributions that exist between Talbot image planes so that a dose distribution is delivered to the photoresist that is substantially insensitive to variations in the separation between the mask and the wafer, and moreover so that this insensitivity is achieved over a range of pattern types and periods simultaneously.

According to a first aspect of the present invention, a method is provided for printing a desired pattern of periodic features, which includes:
a) providing a mask bearing a mask pattern of periodic features having an array type and a period;
b) providing a substrate bearing a photosensitive layer;
c) arranging the substrate substantially parallel to and with a separation from the mask;
d) generating substantially collimated light with a wavelength and an intensity, at least the former of which may be temporally varied to deliver a spectral distribution of energy density;
e) illuminating the mask pattern with said light whilst varying at least its wavelength so as to deliver a spectral distribution of energy density, such that the light-field transmitted by the mask is instantaneously composed of a range of transversal intensity distributions between Talbot planes, and whereby the photosensitive layer is exposed to a time-integrated intensity distribution that prints the desired pattern;
wherein the separation and spectral distribution are arranged in relation to the period and array type so that the time-integrated intensity distribution corresponds substantially to an average of the range of transversal intensity distributions.

The intensity of the beam may be constant during the variation of wavelength or it may vary.

The exposure energy density illuminating the mask per incremental change of wavelength may be constant, or substantially so, as the wavelength is varied across the range of wavelengths in the spectral distribution of energy density. With such a flat spectral distribution, the separation of the mask and substrate should preferably be arranged so that, for the mask pattern concerned, the change of wavelength across the range causes the transversal intensity distribution illuminating the photoresist to longitudinally displace by a distance (as would be measured if the propagating medium is air) that corresponds substantially to the Talbot period, or an integer multiple thereof, of the transmitted light-field produced by light with the central wavelength of the range. For this case, the intensity of the illumination beam and the rate at which the wavelength is varied are preferably both constant, or substantially so, as the wavelength is varied across the range.

Advantageously, the exposure energy density illuminating the mask per incremental change of wavelength across the range of wavelengths in the spectral distribution varies according to one of a Gaussian, triangular, truncated cosine or similar distribution and the full-width half-maximum value (FWHM) of the distribution is preferably arranged so that, for the particular mask pattern concerned, a change of wavelength across the FWHM of the distribution causes the transversal intensity distribution illuminating the photoresist to displace longitudinally by a distance (as would be measured if the propagating medium is air) that is at least the Talbot period of the transmitted light-field produced by light with the central wavelength of the range. To obtain one of such spectral distributions of exposure energy density, either the intensity of the illumination beam may be varied according to the desired Gaussian, triangular, truncated cosine or similar distribution as the wavelength is varied, at a constant rate, across the range; or, alternatively, the intensity of the illumination beam may be substantially constant as the wavelength is varied across the range, and the wavelength is varied with a variable rate so as to produce the desired spectral distribution; or a combination of these two methodologies may be employed. Other spectral distributions of exposure energy may be alternatively employed.

Preferably, the wavelength is varied in a continuous manner across the range or, alternatively, it may be varied across the range in a step-wise manner using incremental changes in wavelength that are small in relation to the range of wavelengths in the spectral distribution.

Preferably, the wavelength is varied across the range of wavelengths in the spectral distribution once during the illumination of the mask pattern; or, alternatively, it may be varied across the range a plurality of times the with the direction of wavelength variation being the same or reversed between successive variations.

According to a second aspect of the present invention, an apparatus is provided for printing a desired pattern of periodic features, which includes:

a) a mask bearing a mask pattern of periodic features having an array type and a period;
b) a substrate bearing a photosensitive layer;
c) a means for arranging the substrate substantially parallel to and with a separation from the mask;
d) a means for generating substantially collimated light with a wavelength and an intensity and for temporally varying at least the former in order to deliver a spectral distribution of energy density;
e) a means for illuminating the mask pattern with said light whilst varying at least its wavelength so as to deliver a spectral distribution of energy density, such that the light-field transmitted by the mask is instantaneously composed of a range of transversal intensity distributions between Talbot planes, and whereby the photosensitive layer is exposed to a time-integrated intensity distribution that prints the desired pattern; wherein the separation and spectral distribution are arranged in relation to the period and array type so that the time-integrated intensity distribution corresponds substantially to an average of the range of transversal intensity distributions.

Preferred examples of the present invention are hereinafter described with reference to the following figures.

Figure 1:
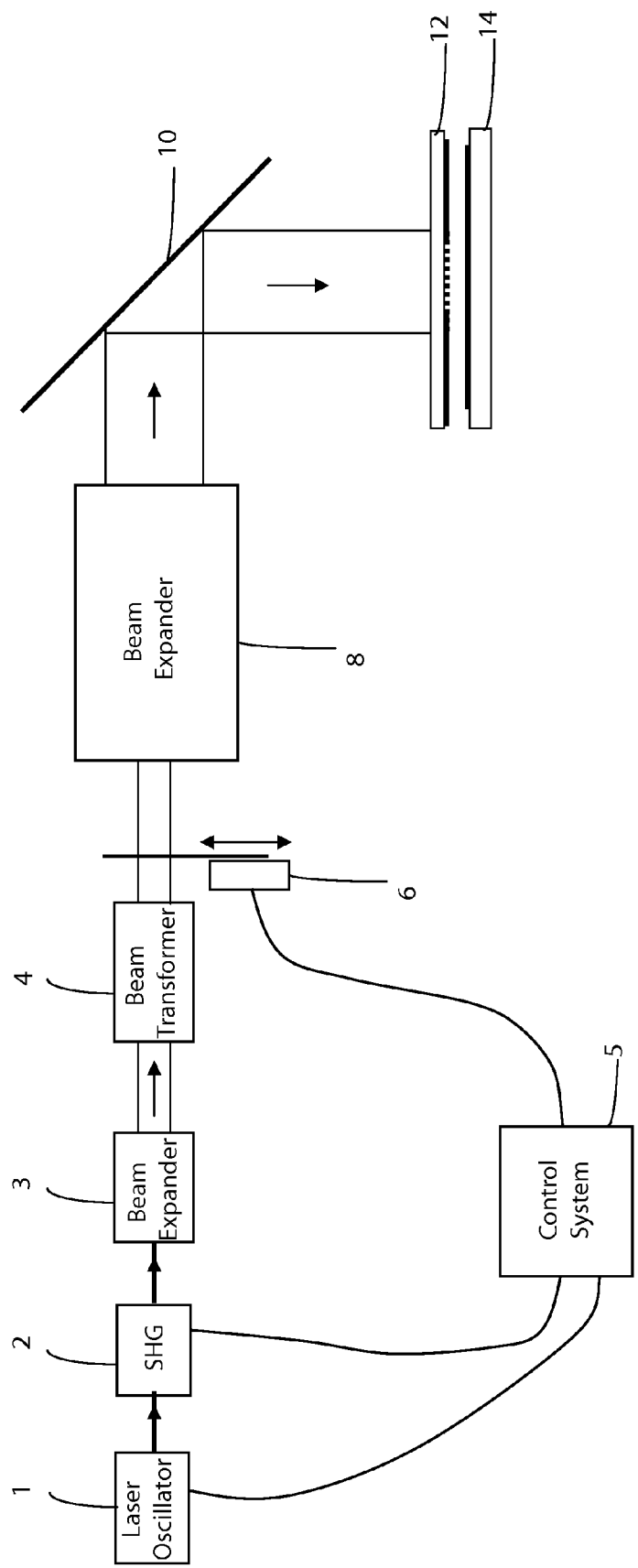
FIG. 1 illustrates a first embodiment of the invention.
Figure 2:
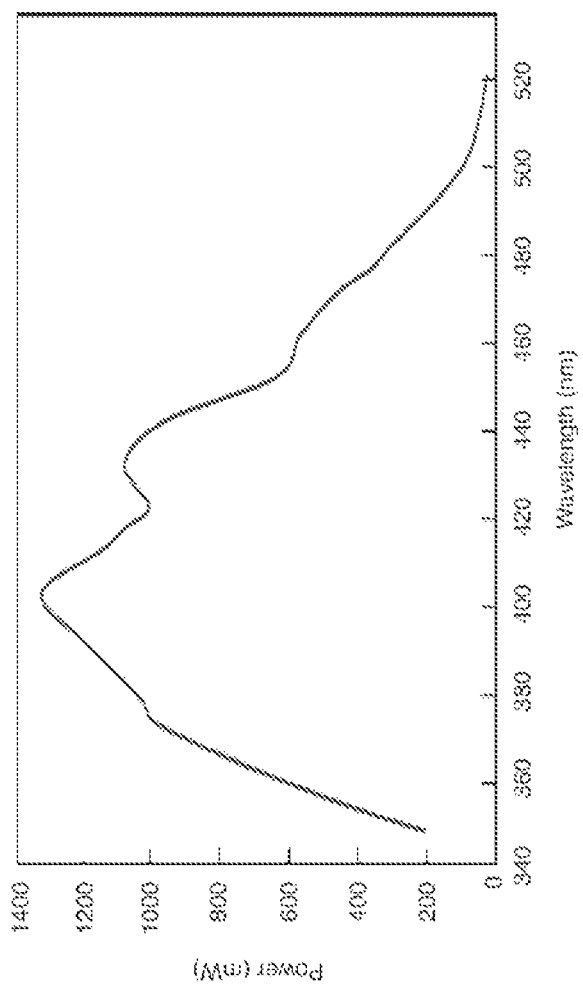
FIG. 2 shows the dependence of power on wavelength for a beam from a commercially available tuneable laser system.

In a first exemplary embodiment of the present invention, with reference to FIG. 1, a wavelength-tuneable titanium-sapphire laser oscillator 1 (for instance, a Mai Tai system manufactured by Newport/Spectra-Physics that includes a Millennia series diode-pumped solid-state laser for pumping the oscillator) emits a polarized beam of light in TEM00 mode (i.e. with a Gaussian intensity profile) that has an approximately circular cross-section and a diameter ~1 mm ($1/e^2$ value). The light from the laser oscillator 1 is delivered in pulses with pulse length ~0.1 ps and frequency 80 MHz and its wavelength can be tuned over a range 690-1040 nm. The beam is incident on a frequency-doubling unit 2 (for instance, an Inspire Blue unit also manufactured by Newport/Spectra-Physics) that halves the beam's wavelength by second harmonic generation (SHG), so that the wavelength of the output beam is tuneable over the range ~345-520 nm. The frequency-doubling unit has a motorized drive that enables the angle of the SHG crystal to be automatically tuned to the input wavelength. The laser oscillator 1 and frequency-doubling unit 2 are connected to a control system 5 that enable the beam's wavelength to be automatically scanned or stepped across a part or the whole of this range. As the wavelength is scanned or stepped over this range, the power of the beam is not necessarily constant but may vary. For a Mai Tai and Inspire Blue system, the power of the output beam varies as the wavelength is scanned in the manner illustrated in FIG. 2 (from manufacturer's data sheet). The beam passes through a beam expander 3 comprising a plano-concave lens and a plano-convex lens and the resulting, enlarged collimated beam is incident on a beam transformer 4 that converts the beam's Gaussian intensity profile into a substantially flat-top distribution with a diameter similar to that of the input beam. A suitable beam transformer is one of the piShaper series manufactured by the company Molecular Technology GmbH. The lenses of the beam expander 3 are selected such that the diameter of the transmitted beam satisfies the requirements for the beam transformer 4. The beam from the transformer 4 passes through an electronically activated shutter 6, also connected to the control system 5, and then passes through a second beam expander 8, again comprising a pair of lenses, to form a beam of collimated light whose intensity is substantially uniform over an area with diameter ~100 mm. This beam is reflected by a mirror 10 so that it illuminates a mask 12 at substantially normal incidence.

The mask 12 bears a periodic pattern on its lower surface. The pattern is a linear grating composed of alternating parallel opaque lines and spaces with a period of 1 μm, that has been fabricated in a layer of chrome on a fused silica substrate. The mask 12 is preferably oriented such that the lines of the grating are parallel to the plane of polarization of the incident beam. The mask 12 is held by a vacuum chuck that is mounted to a positioning system (not shown in the figure), which is comprised of an arrangement of tilting and translation stages, that enables the mask 12 to be positioned substantially parallel to and at a desired distance from a substrate 14 located below the mask 12.

The upper surface of the substrate is coated with a layer of a standard photoresist and its lower surface is held by another vacuum chuck (not shown) so that its upper surface is substantially flat. The degree of parallelism and the separation between the mask 12 and substrate 14 may be determined using reference gauges of known thickness to probe the gap between the mask 12 and substrate 14; or, preferably, they may be more accurately determined using an optical interferometer (such as one based on white-light, or broad-band, interferometry) to measure the local separation of the mask 12 and substrate 14 at different locations over the area of the mask 12. Using such measuring means and the mask positioning system the mask may be arranged substantially parallel to and at a desired distance from the photoresist-coated substrate.

According to the prior art, illumination of a grating pattern generates self-images of the pattern that are longitudinally separated by a Talbot distance. Therefore, placing a photoresist-coated substrate in the transmitted light-field and varying the illumination wavelength during exposure causes the self-images, and the aerial interference pattern generally, to longitudinally displace with respect to the substrate. If the period of the grating is much larger than the illumination wavelength, then the Talbot distance may be estimated using equ. (1). In this case, if the separation, d, between the substrate and mask is arranged in relation to the period of the grating, p, and to the range of wavelength variation, Δλ, so that $$d \approx 2p^2/\Delta\lambda, \qquad \text{equ. (3)}$$

then, as the wavelength is varied across the range, the transversal intensity distribution illuminating the photoresist layer is longitudinally displaced by substantially the Talbot distance of the light-field formed by light of the central wavelength of the range (if the wavelength is decreasing, it should be understood that the displacement distance refers to that which would occur if the propagating medium were air without the presence of the photoresist and substrate).

It can be appreciated that if the intensity of the light is constant, or substantially so, as the wavelength is varied across the range (such that the spectral distribution of the energy density illuminating the mask per incremental change of wavelength has a rectangular profile), then the photoresist is exposed to a time-integrated intensity distribution that is equivalent to that produced by a DTL exposure according to the teaching of EP1810085 in which the separation between the mask and substrate is varied during an exposure by monochromatic light; and therefore offers the same advantages as that prior-art technique, namely a halving of the period of the printed pattern with respect to that in the mask, a large depth of focus, and high uniformity and reproducibility of the printed pattern.

Generally, and especially if the period of the grating in the mask is not much greater than the illumination wavelength such that only low-order diffracted beams are present in the transmitted light-field, the Talbot distance using a particular illumination wavelength, $S(\lambda)$, is more accurately given by $$S(\lambda) = \frac{\lambda}{1 - \cos\varphi(\lambda)} \qquad \text{equ. (4)}$$

where $\pm\phi(\lambda)$ are the diffraction angles of the $\pm$1st-order beams (which, for a linear grating, are given by $\sin\phi(\lambda)=\lambda/\rho$).

Based on this expression, the separation of the mask and substrate required for the transversal intensity distribution illuminating the photoresist to longitudinally displace by a Talbot distance of the light-field produced by light of the central wavelength, $\lambda_o$, as the wavelength is varied across the range, is derived to be $$d \approx \frac{\lambda_0^2 \cos\varphi(\lambda_0)}{\Delta\lambda\{1 - \cos\varphi(\lambda_0)\}} \qquad \text{equ. (5)}$$

where $\pm\phi(\lambda_o)$ are the diffraction angles of the $\pm1^{st}$-order beams in the transmitted light-field produced by light of the central wavelength.

As previously, if the intensity of the light is constant, or substantially so, as the wavelength is varied across the range then the photoresist is exposed to an integrated intensity distribution that is equivalent to that produced by a DTL exposure according to the prior art of EP1810085, and therefore provides the same advantages.

Using the particular Mai Tai and Inspire Blue laser system of the first embodiment, a wavelength range of 395-405 nm is selected to enable a high intensity of the illumination beam, which is advantageous for minimising the exposure time, and, secondly, so that the beam's intensity is substantially constant as the wavelength is varied across the range.

Applying equs. (4) and (5) with $\lambda=\lambda_o=400$ nm, $\Delta\lambda=10$ nm and p=1 µm, it is calculated that the diffraction angles of the $1^{st}$ orders is 23.6°, the Talbot distance of the light-field produced by light of the central wavelength is 4.8 µm; and, therefore, the separation of the mask and substrate required for the transversal intensity distribution illuminating the photoresist to displace by a Talbot distance, as the wavelength across the range, is ~174 µm.

This separation between mask and substrate is obtained using the mask positioning system and measurement methods previously described. Exposure is performed by setting the initial output wavelength of the laser system to 395 nm, opening the shutter 6, and then scanning the wavelength at a constant speed, by means of the computer-controlled laser oscillator system 1 and frequency doubler 2, to the final wavelength of 405 nm, after which the shutter 6 is closed. The speed of wavelength scan employed for the first exposure may be selected by measuring the intensity of the beam illuminating the mask and then estimating the duration of exposure required so that the exposure dose is suitable for the particular photoresist process. Thereafter, the speed of scan may be optimised by evaluating the resulting patterns printed into the photoresist using standard equipment and procedures, and conducting further exposures with modified exposure parameters. Since the mask pattern employed in this embodiment is a linear grating, the resulting pattern formed in the photoresist is, as for a DTL-exposure according to the prior art, a grating with half the period of that in the mask, that is, 0.5 µm.

Since, as mentioned, varying the wavelength of the Mai Tai and Inspire Blue system from 395-405 nm introduces some modulation (~±4%) into the intensity of the illumination beam, the resulting integrated intensity distribution exposing the photoresist is slightly distorted with respect to that produced by the DTL technique, however, this may generally be considered negligible. If a better approximation to a DTL exposure is required for a particular application, then the intensity variation during the wavelength scan may be compensated either by means of a motorized variable attenuator, also connected to the control system 5, that is included in the beam path after the laser; or by modulating the speed at which the wavelength is varied across the range so that exposure dose per incremental change of wavelength is constant across the range. Ideally, the laser system should enable the intensity of the output beam to remain constant as its wavelength is varied across a range.

It should be understood that the one-dimensional mask pattern employed in this embodiment is only by way of example and that a two-dimensional pattern, such as a periodic array of features arranged on a hexagonal grid, may be alternatively employed. With such two-dimensional patterns equs. (4) and (5) may also be employed to determine respectively the Talbot distance of the transmitted light-field and the separation required between the mask and substrate, in combination with a selected range of wavelength variation, for obtaining a DTL-like exposure into the photoresist.

In another variant of the first embodiment, the separation of the photoresist-coated substrate and mask is instead adjusted in relation to the range of wavelength variation, $\Delta\lambda$, during exposure so that $$d \approx \frac{N\lambda_0^2 \cos\varphi(\lambda_0)}{\Delta\lambda\{1 - \cos\varphi(\lambda_0)\}} \qquad \text{equ. (6)}$$

where N is an integer>1, and $\pm\phi(\lambda_o)$ are the diffraction angles of the $\pm1^{st}$-order beams in the transmitted light-field produced by light of the central wavelength.

By varying the wavelength across the range in combination with one of the values of separation given by equ. (6), the transversal intensity distribution illuminating the photoresist layer is longitudinally displaced by a multiple of the Talbot distance of the light-field formed by light of the central wavelength (as previously, if the wavelength is varied from a higher to a lower value, the displacement distance refers to that which would occur if the propagating medium were air without the presence of the photoresist and substrate). So, if the intensity of the light is constant, or substantially so, as the wavelength is varied across the range, then the photoresist is exposed to a time-integrated intensity distribution that is again equivalent to that produced by a DTL exposure according to the prior-art teaching of EP1810085, with similarly advantageous results. A disadvantage of using a larger separation, however, is that a higher degree of collimation is required of the illumination beam in order that the same contrast of intensity oscillation is obtained in the integrated distribution exposing the photoresist (the considerations and requirements with respect to beam collimation are essentially the same as for standard Talbot imaging of periodic patterns in masks).

Figure 3:
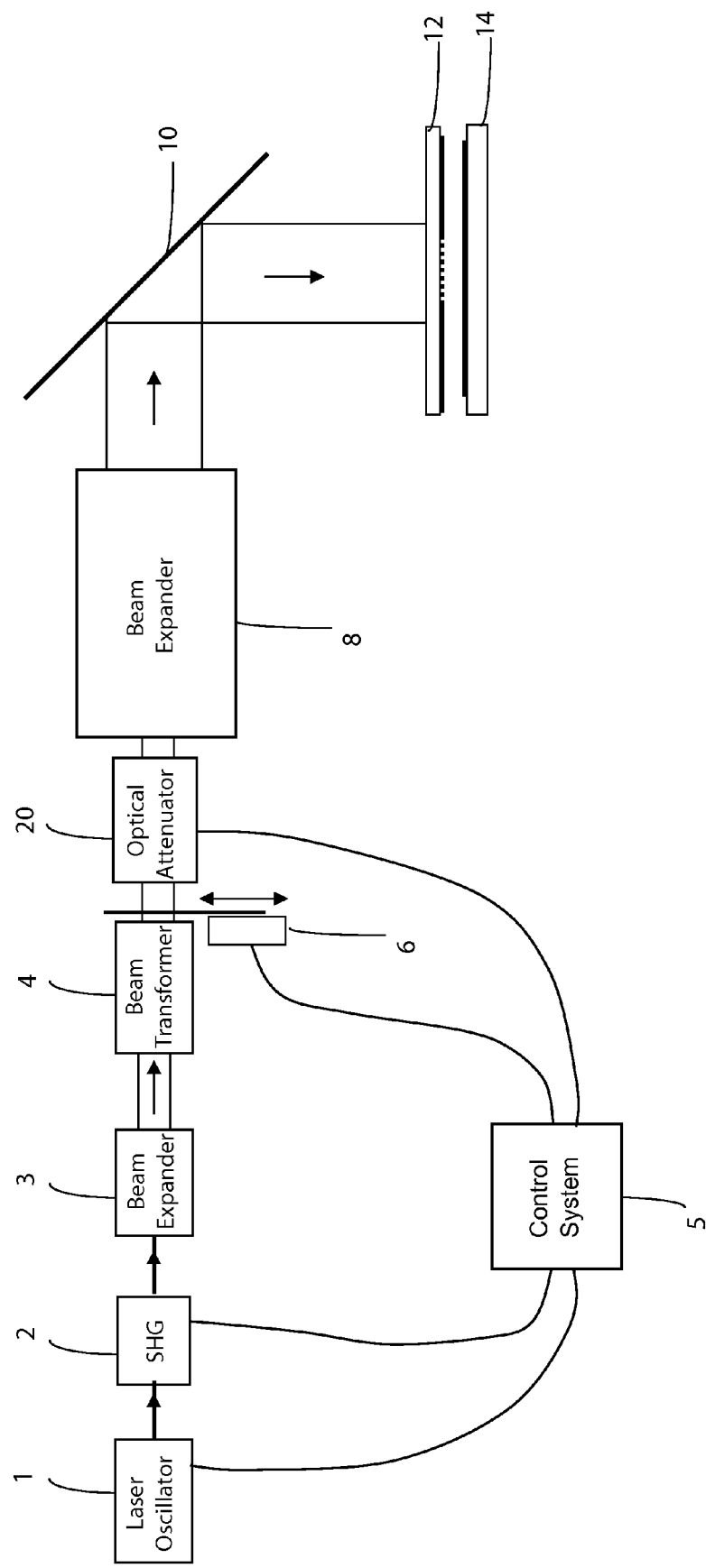
FIG. 3 illustrates a second embodiment of the invention.

Whereas the patterns printed using the first embodiment and variations thereof have a significantly larger depth of focus than that obtained using standard Talbot imaging according to the prior art, the line-width of the printed patterns exhibit some variation when the separation of the photoresist-coated substrate and mask deviates from the values calculated using equ. (3), (5) and (6). This residual dependence of the line-width on the separation of the mask and substrate may be further reduced using a second exemplary embodiment of the invention. With reference to FIG. 3, a pattern in a mask 12 comprises a two-dimensional array of holes arranged on a hexagonal grid that has been formed in a layer of chrome on a fused silica substrate using conventional lithographic techniques. The nearest-neighbour distance of the holes in the hexagonal array is 0.6 μm and their diameter is ~0.3 μm. The exposure system is substantially the same as for the first embodiment except that a variable optical attenuator 20 is included in the beam path after the shutter 6. The variable attenuator 20 is motorized and connected to the control system 5 so that its transmission may be modulated as the wavelength is varied during the illumination of the mask. Suitable motorized variable attenuators are commercially available from such companies as Metrolux Optische Messtechnik GmbH (for example, its range of Variable Dielectric Laser Beam Attenuators) and Del Mar Photonics Inc. (for example, its range of Diffractive Variable Attenuators). The control system is programmed to modulate the transmission of the variable attenuator 20 as the wavelength is scanned during exposure of the mask 12 so that the dependence of the intensity of the illumination beam on wavelength, $I(\lambda)$, corresponds substantially to a truncated Gaussian profile described by $$I(\lambda) = I_0 \exp\{-(\lambda-\lambda_0)^2/2\sigma^2\}, \text{ with } |\lambda-\lambda_0| \le t\sigma \quad \text{equ. (7)}$$

where $I_0$ is the intensity at the central wavelength $\lambda_0$, $\sigma$ is the standard deviation of the Gaussian distribution, and t is a truncation parameter which is preferably ≥2.

The value of $\sigma$ is preferably arranged in relation to the separation of the photoresist-coated substrate and mask, d, the central wavelength and period of the mask pattern so that a change of wavelength between the values $\lambda_0 \pm \sigma$ causes the transversal intensity distribution illuminating the photoresist to longitudinally displace by a distance that corresponds substantially to at least the Talbot period of the light-field produced by light of the central wavelength (as previously, the displacement distance refers to that which occurs or would occur in air), so may be calculated using:

$$\sigma \ge \frac{\lambda_0^2 \cos\varphi(\lambda_0)}{2d\{1-\cos\varphi(\lambda_0)\}} \quad \text{equ. (8)}$$

where $\varphi(\lambda_0)$ are the diffraction angles of the $1^{st}$-order beams (with respect to the normal to the mask) in the light-field produced by light of the central wavelength.

So, if the central wavelength is selected to be 400 nm and the separation between the mask and substrate is arranged (using the mask positioning system and measurement procedures as described in the first embodiment) to be ~50 μm, then for the particular mask pattern concerned (for a hexagonal array, the diffraction angle of the 1st-orders is related to the nearest-neighbour distance of the pattern, $p_n$, and illumination wavelength by $\sin\varphi(\lambda) = 2\lambda/\sqrt{3}p_n$), it is calculated that $\varphi(400 \text{ nm}) = 50.3°$, and therefore that $\sigma \ge 2.8$ nm (conversely, if d≥50 μm, then $\sigma = 2.8$ nm would be a suitable selection). If the truncation parameter is selected to be 2, then the full range of the wavelength scan should be ~11 nm.

Since the mask pattern employed in this embodiment is a hexagonal array of holes in an opaque layer, the resulting integrated intensity distribution exposing the photoresist is a hexagonal array of intensity peaks with the same nearest-neighbour period as the pattern in the mask, and so forms a hexagonal array of holes in positive-tone photoresist.

By employing a spectral distribution of energy density per incremental change of wavelength that has a truncated-Gaussian profile, the effect on the integrated intensity distribution exposing the resist is equivalent to that obtained in PCT/IB2011/054509 by varying the rate of change of separation between the mask and substrate such that the exposure dose per incremental change of separation varies according to a substantially truncated-Gaussian distribution. This profile of spectral distribution therefore reduces the residual dependence of the integrated intensity distribution exposing the photoresist on the separation of the mask and photoresist-coated substrate, and so enables improved uniformity and reproducibility of the printed pattern in comparison with the results obtainable using the first embodiment of the present invention.

Whereas the minimum value of $\sigma$ calculated using equ. (8) provides high insensitivity of the size of the printed features to variation in the separation between the mask and substrate, larger values of $\sigma$ may be employed to reduce the sensitivity further. Smaller values of $\sigma$ may be used if the particular application concerned has a high tolerance to feature size variation.

The dependence of the integrated intensity distribution exposing the photoresist on the mask design and on the parameters of the exposure process may be determined by computer simulation techniques equivalent to those described and employed in PCT/IB2011/054509. Whereas in that application the simulations were performed by integrating the transversal intensity distribution illuminating the photoresist-coated substrate over a range of varying separation of the substrate and mask, in the present invention they should be performed by integrating the transversal intensity distribution over the range of varying wavelengths, taking into account also any variation of the beam's intensity over the wavelength range. Such computer simulations are preferably performed using standard theoretical methodologies for calculating the propagation of electromagnetic waves through periodic micro-structures and through uniform media, such as finite difference time domain (FTDT) or rigorous coupled wave analysis (RCWA). Commercially available software may be used, such as GSolver (in the case of RCWA, produced by the company Grating Solver Development Co.) or MEEP (in the case of FTDT, produced by Massachusetts Institute of Technology).

It should be understood that the particular two-dimensional mask pattern employed in this embodiment is only by way of example and that other types of two-dimensional array or one-dimensional periodic pattern may be alternatively employed in combination with appropriately selected exposure conditions to produce similarly advantageous results.

Analogously to the teaching of PCT/IB2011/054509, a truncated-Gaussian profile of spectral distribution enables, in other embodiments of the present invention, firstly, periodic mask patterns to be printed uniformly and reproducibly when the presence of 2nd or higher diffraction orders in the transmitted light-field from the mask pattern prevents an exact Talbot images from being formed; secondly, two-dimensional periodic patterns of features to be printed uniformly and reproducibly when the periods of the mask pattern are different along different axes (such as a rectangular array); and, thirdly, patterns of features to be printed uniformly and reproducibly onto a substrate when the period of the mask pattern is not constant across the pattern but varies either continuously (as in chirped gratings), or in a step-wise manner (such as a pattern comprising a plurality of sub-patterns of periodic features, with different sub-patterns having different periods).

In variants of the second embodiment, the variable attenuator 20 is alternatively employed to modulate the intensity of the illumination beam during the wavelength scan so that the dependence of intensity on wavelength corresponds substantially to a (un)truncated triangular profile described by $$I(\lambda)=I_0(\Delta\lambda-|\lambda-\lambda_0|), \text{ with } |\lambda-\lambda_0|\leq t\Delta\lambda, \qquad \text{equ. (9)}$$

where $I_0$ is the intensity at the central wavelength $\lambda_0$, $2\Delta\lambda$ is the full width of the untruncated distribution, and t is a truncation parameter $\leq 1$; or a truncated cosine profile described by $$I(\lambda)=E_0 \cos^2\{\pi(\lambda-\lambda_0)/2\Delta\lambda\}, \text{ with } |\lambda-\lambda_0|\leq t\Delta\lambda \qquad \text{equ. (10)}$$

where $I_0$ is the intensity at the central wavelength $\lambda_0$, $2\Delta\lambda$ is the period of the distribution, and t is a truncation parameter (when t=1, the distribution is truncated to one period of the oscillation); or similar profile, such as a suitable trapezoidal distribution.

The values of the truncation parameters are preferably selected to be close to 1 to ensure a relatively smooth transition to zero intensity at the ends of the profile. The values of $\Delta\lambda$ in these profiles are preferably arranged in relation to the separation of the photoresist-coated substrate and mask, the central wavelength and the period of the mask pattern so that a change of wavelength across the FWHM of the profile causes the transversal intensity pattern illuminating the photoresist to longitudinally displace by a distance corresponding to at least the Talbot distance of the light-field produced by the central wavelength (as previously, the displacement distance refers to that which occurs or would occur in air). Further, the full width of the spectral intensity distribution preferably corresponds substantially to twice the FWHM value.

By employing a spectral distribution of energy density per incremental change of wavelength that has an (un)truncated triangular, truncated cosine or similar profile, the effect on the integrated intensity distribution exposing the photoresist is substantially equivalent to that obtained in PCT/IB2011/054509 by varying the separation of the mask and substrate during exposure such that the exposure dose per incremental change of separation varies according to a (un)truncated triangular, truncated cosine or similar profile. Such a spectral distribution therefore similarly reduces the residual sensitivity of the feature sizes of the printed pattern to variation of the separation of the mask and substrate, and similarly improves the uniformity and reproducibility of the printed pattern in comparison with the results obtained using the first embodiment of the present invention.

These alternative spectral distributions likewise enable, firstly, periodic patterns to be printed uniformly and reproducibly when the presence of 2nd or higher diffraction orders in the transmitted light-field prevents exact Talbot imaging; secondly, two-dimensional periodic patterns of features to be printed uniformly and reproducibly when the periods of the pattern are different along different axes; and, thirdly, periodic patterns to be printed uniformly and reproducibly onto substrates when the period of the pattern in the mask is not constant across the pattern but varies either continuously (as in chirped gratings) or in a step-wise manner.

The dependence of the integrated intensity distribution exposing the photoresist on the mask design and on the exposure parameters, for the purpose of optimising the formation of the desired printed pattern, may be evaluated by computer simulation techniques equivalent to those described and employed in PCT/IB2011/054509. Whereas in that application the simulations were performed by integrating the transversal intensity distribution illuminating the photoresist-coated substrate over a range of separations of the substrate and mask, in the present invention they should be performed by integrating the transversal intensity distribution over the range of wavelengths, taking into account also any variation of the beam's intensity over the wavelength range.

In another variant of the first embodiment of the invention that achieves substantially the same printed results and advantages of the second embodiment (or its variants), the illumination generates a beam whose intensity is constant, or substantially so, as the wavelength is varied across the range, but the beam's wavelength is not scanned at a constant speed during the exposure but is instead scanned with a varying speed so that the dependence of exposure energy density per incremental change of wavelength corresponds to that obtained in the second embodiment or one of its variants, namely, to one of a truncated Gaussian, (un)truncated triangular and truncated cosine profile, or similar profile. By varying the speed of wavelength scan as the wavelength is scanned across the range (such that the instantaneous speed is inversely proportional to the required exposure energy density per incremental change of wavelength for the wavelength concerned), the photoresist may be exposed to substantially the same integrated intensity distribution as obtained in the second embodiment, or variant thereof, and thus prints substantially the same patterns as those embodiments with the same advantages. The intensity of the illumination beam is preferably constant, or substantially so, as the wavelength is scanned with varying speed across the range though, if necessary, the variation of the speed of wavelength scan may additionally compensate any fluctuation of the beam's intensity with wavelength so that the resulting spectral distribution of energy density illuminating the mask per incremental change of wavelength more exactly matches the desired profile. To achieve this, it is preferable that the dependence of the beam's intensity on wavelength is firstly characterised, after which the variation, or modulation, required to the speed of scan over the wavelength range may then be determined for obtaining the desired truncated Gaussian, (un)truncated triangular, truncated cosine, or other such profile describing the spectral distribution of energy density per incremental change of wavelength. The optimum spectral distribution and mask pattern for printing a desired periodic pattern into the photoresist may be similarly determined using computer simulation techniques equivalent to those described and employed in PCT/IB2011/054509.

Whereas a particular type of beam expander, a particular type of beam transformer and a mirror are employed in the above embodiments for generating a reasonably uniform illumination of mask patterns whose dimensions are large in relation to the cross-section of the beams emitted from the lasers employed, it should be understood that in other embodiments of the invention other types of optical elements and other combinations of the same and/or other types of optical elements may be alternatively used for providing uniform illumination of the mask pattern, or for providing a particular non-uniform illumination of a mask pattern so as to, for example, expose only a part of the total mask pattern.

In variants of the first, second and third embodiments of the invention, the wavelength is not scanned continuously, either at a constant speed or with variable speed, over a wavelength range during exposure, but is instead stepped in a series of wavelength increments that are small in relation to the range. More specifically, with respect to the first and second embodiments, by using instead a constant wavelength increment and the same exposure time after each increment as the wavelength is stepped across the range, the photoresist may be exposed to substantially the same integrated transversal intensity distributions as obtained in the first and second embodiments respectively, and so substantially the same patterns may be printed with the same advantages; and, with respect to the third embodiment, by using instead a constant wavelength increment as the wavelength is stepped over the range and varying the exposure time between increments or, alternatively, by varying the size of the increment as the wavelength is stepped across the range and using the same exposure time after each increment, the photoresist may be exposed to substantially the same integrated transversal intensity distribution as obtained in the third embodiment, and so substantially the same pattern may be printed with the same advantages.

In those embodiments of the invention in which the pattern in the mask is a two-dimensional periodic pattern, such as an array of holes on a square or hexagonal grid, and in which the laser source emits a beam that is plane-polarized, it is preferable that the exposure system additionally includes an element for either depolarizing the beam, or for producing a circularly polarized beam, or for otherwise removing the asymmetric polarization of the illuminating beam with respect to the mask pattern, in order asymmetry is not undesirably introduced into the printed pattern, particularly with respect to the shape of the printed features.

In the above and other embodiments of the invention the illumination beam may be alternatively derived from a laser without an intermediate oscillator and the wavelength scanned across the spectral bandwidth of the lasing material.

In the above and other embodiments of the invention, the illumination beam may be alternatively derived from a laser source that emits a continuous-wave beam rather than a pulsed beam.

In the above and other embodiments the illumination beam may be alternatively derived from a diode laser whose output wavelength is varied over a range of a few nanometers by changing the temperature of the laser.

In the above or other embodiments of the invention the mask may be alternatively formed using phase shifting materials rather than opaque and transparent materials as employed in amplitude masks.

In other embodiments of the invention the range of exposure wavelengths employed may be in another part of the electromagnetic spectrum, such as in the visible, deep-UV, EUV or x-ray regions. For these cases, the light source, beam shaping optics, mask and photosensitive layer and elements generally should be selected appropriately.

In the above or other embodiments of the invention a fluid such as water may be included between the photoresist-coated substrate and the mask in order to reduce the limit of the period of pattern that may be printed using a given range of wavelength. If such a fluid is employed, the range of wavelengths should be selected so that varying the wavelength across the FWHM of the spectral intensity distribution causes the transversal intensity distribution illuminating the photoresist to longitudinally displace by a distance that corresponds substantially to the Talbot distance of the light-field produced by light of the central wavelength (where the Talbot distance and the displacement distance refer to the values with the propagating medium being the fluid).

In other embodiments of the invention the variation of wavelength during the exposure may be combined with a variation of the separation during exposure, the range of each being reduced from the value employed in any of the above embodiments and in DTL according to the prior art respectively, such that the integrated intensity distribution to which the photoresist is exposed as a result of the two components of variation corresponds substantially to an average of the range of transversal intensity distributions between Talbot planes.

More generally, while the embodiments described above may be currently considered as preferred embodiments of the invention, it should, of course, be understood that various modifications and changes in form or detail could readily be made without departing from the spirit of the invention.

The invention claimed is:

1. A method of printing a desired pattern of periodic features, the method which comprises:
   providing a mask bearing a mask pattern of periodic features having an array type and a period;
   providing a substrate bearing a photosensitive layer;
   arranging the substrate substantially parallel to and with a separation from the mask;
   generating substantially collimated light with a wavelength and an intensity, wherein at least the wavelength is temporally variable to deliver a spectral distribution of energy density;
   illuminating the mask pattern with the light while varying at least the wavelength thereof so as to deliver a spectral distribution of energy density, such that a light-field transmitted by the mask is instantaneously composed of a range of transversal intensity distributions between Talbot planes, and wherein the photosensitive layer is exposed to a time-integrated intensity distribution printing the desired pattern;
   wherein the separation and the spectral distribution are configured in relation to the period and array type so that the time-integrated intensity distribution corresponds substantially to an average of the range of transversal intensity distributions.

2. The method according to claim 1, which comprises varying the wavelength at a constant rate or a variable rate during the step of illuminating the mask pattern.

3. The method according to claim 1, wherein the spectral distribution of energy density is substantially flat with a spectral range such that varying the wavelength across the range causes the transversal intensity distribution illuminating the photoresist to longitudinally displace by a distance that corresponds substantially to the Talbot period, or an integer multiple thereof, of the transmitted light-field produced by light at the central wavelength of the range.

4. The method according to claim 1, wherein the spectral distribution of energy density corresponds substantially to one of a Gaussian, triangular and truncated cosine profile, and a full-width half-maximum spectral range of the profile is such that varying the wavelength across the range causes the transversal intensity distribution illuminating the photoresist to longitudinally displace by a distance that corresponds substantially to at least the Talbot period of the transmitted light-field produced by light at the central wavelength of the range.

5. The method according to claim 1, which comprises continuously varying the wavelength during the illuminating step.

6. The method according to claim 1, which comprises varying the wavelength in steps during the illuminating step.

7. The method according to claim 1, wherein the array type is selected from the group consisting of a linear grating, a hexagonal array, a square array and a rectangular array.

8. The method according to claim 1, which comprises varying the wavelength once or a plurality of times over a range of wavelengths during the illuminating step.

9. The method according to claim 1, wherein the periodic features of both the desired pattern and mask pattern are exactly periodic or are quasi-periodic.

10. The method according to claim 1, wherein the desired pattern of periodic features comprises a plurality of sub-patterns with different periods, the mask pattern comprises a plurality of sub-patterns with different periods, wherein each sub-pattern generates a light-field composed of Talbot planes separated by a Talbot distance, and wherein the tilt angle and the intensity envelope are arranged in relation to the Talbot distance of the light-field from the sub-pattern with a largest period.

11. The method according to claim 1, which further comprises introducing a fluid between the mask and substrate.

12. The method according to claim 1, wherein features of the mask pattern are formed in at least one of a layer of an opaque material and a layer of a phase shifting material, and on a transparent substrate.

13. An apparatus for printing a desired pattern of periodic features, the apparatus comprising:
   a mask bearing a mask pattern of periodic features having an array type and a period;
   a substrate bearing a photosensitive layer;
   a device for arranging the substrate substantially parallel to and with a separation from the mask;
   a generating and varying device for generating substantially collimated light with a wavelength and an intensity and for temporally varying at least the wavelength in order to deliver a spectral distribution of energy density;
   an illumination device for illuminating the mask pattern with the light while varying at least the wavelength thereof so as to deliver a spectral distribution of energy density, such that a light-field transmitted by the mask is instantaneously composed of a range of transversal intensity distributions between Talbot planes, and wherein said photosensitive layer is exposed to a time-integrated intensity distribution printing the desired pattern;
   wherein the separation and spectral distribution are arranged in relation to the period and array type so that the time-integrated intensity distribution corresponds substantially to an average of a range of transversal intensity distributions.

14. The apparatus according to claim 13, wherein said generating and varying device is configured to produce a spectral distribution of energy density that is substantially flat.

15. The apparatus according to claim 13, wherein said generating and varying device is configured to produce a spectral distribution of energy density that corresponds substantially to a Gaussian, triangular or truncated cosine profile.

16. The apparatus according to claim 13, wherein said illumination device is a light-generating and wavelength-varying means including an optical parametric oscillator.

17. The apparatus according to claim 13, wherein said intensity varying device is a variable attenuator.

* * * * *